US011897337B1

(12) United States Patent
Dede et al.

(10) Patent No.: US 11,897,337 B1
(45) Date of Patent: Feb. 13, 2024

(54) SYSTEMS AND METHODS FOR IMPROVING THE BRIGHTNESS OF A TRANSPARENT DISPLAY USING SUPPLEMENTAL LIGHT SOURCES THAT INCLUDE AMBIENT LIGHT COLLECTED BY AN ARRAY OF FRESNEL LENSES

(71) Applicant: Toyota Motor Engineering & Manufacturing North America, Inc., Plano, TX (US)

(72) Inventors: Ercan Mehmet Dede, Ann Arbor, MI (US); Sean P. Rodrigues, Ann Arbor, MI (US); Frederico Marcolino Quintao Severgnini, Ann Arbor, MI (US); Danny J. Lohan, Northville, MI (US); Masaaki Kawauchi, Chita County (JP); Kojiro Tachi, Nagakute (JP); Hiroshi Ando, Nagoya (JP)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 0 days.

(21) Appl. No.: 18/071,964

(22) Filed: Nov. 30, 2022

(51) Int. Cl.
| | | |
|---|---|---|
| *G02F 1/13357* | (2006.01) | |
| *B60K 35/00* | (2006.01) | |
| *H01L 31/054* | (2014.01) | |
| *G02B 5/18* | (2006.01) | |

(52) U.S. Cl.
CPC ............ *B60K 35/00* (2013.01); *G02B 5/1885* (2013.01); *G02F 1/133615* (2013.01); *H01L 31/0543* (2014.12); *B60K 2370/1438* (2019.05); *B60K 2370/1526* (2019.05); *B60K 2370/25* (2019.05);

(Continued)

(58) Field of Classification Search
CPC ............ G02F 1/1336; G02F 1/133615; G09G 3/3406; F21S 11/00; F21V 2200/10
See application file for complete search history.

(56) References Cited

U.S. PATENT DOCUMENTS

| | | |
|---|---|---|
| 4,711,512 A | 12/1987 | Upatnieks |
| 7,295,372 B2 | 11/2007 | Steneby |
| 7,813,061 B2 | 10/2010 | Steneby |

(Continued)

OTHER PUBLICATIONS

"About Parans Solar Lighting." <https://www.parans.com/parans-light/about-parans-solar-lighting/> Accessed Aug. 22, 2022.

(Continued)

*Primary Examiner* — Yuzhen Shen
(74) *Attorney, Agent, or Firm* — Christopher G. Darrow; Darrow Mustafa PC

(57) ABSTRACT

Systems and methods for improving the brightness of a transparent display are disclosed herein. One embodiment collects ambient light using an array of Fresnel lenses disposed on an external surface of a vehicle; collects internal light from the vehicle's headlights; filters the ambient light and the internal light to produce filtered ambient light and filtered internal light; generates primary-source light using a light-emitting-diode (LED) light source; and injects, into a transparent edge-lit liquid crystal waveguide display deployed in at least a portion of a window of the vehicle, the primary-source light, the filtered ambient light, and the filtered internal light in a color-synchronized manner. The filtered ambient light and the filtered internal light improve the brightness of the transparent edge-lit liquid crystal waveguide display.

20 Claims, 11 Drawing Sheets

(52) U.S. Cl.
CPC .. *B60K 2370/332* (2019.05); *B60K 2370/349* (2019.05); *B60K 2370/785* (2019.05)

(56) References Cited

U.S. PATENT DOCUMENTS

| | | |
|---|---|---|
| 10,324,237 B2 | 6/2019 | Soljacic et al. |
| 11,431,286 B2 | 8/2022 | Severgnini et al. |

OTHER PUBLICATIONS

"How to Create Sunlight Readable TFT LCD", Topway Display. Jul. 14, 2021. <https://www.topwaydisplay.com/en/blog/how-to-make-TFT-LCD-sunlight-readable>.

K. Shastri et al. "To What Extent Can Space Be Compressed? Bandwidth Limits of Spaceplates." arXiv:2201.11340v2 [physics.optics] Feb. 9, 2022. https://opg.optica.org/optica/viewmedia.cfm?uri=optica-9-7-738&seq=0.

O. Reshef et al. "An Optic to Replace Space and Its Application Towards Ultra-Thin Imaging Systems." Nature Communications. https://doi.org/10.1038/s41467-021-23358-8.

SYSTEMS AND METHODS FOR IMPROVING THE BRIGHTNESS OF A TRANSPARENT DISPLAY USING SUPPLEMENTAL LIGHT SOURCES THAT INCLUDE AMBIENT LIGHT COLLECTED BY AN ARRAY OF FRESNEL LENSES

TECHNICAL FIELD

The subject matter described herein generally relates to display technology and, more particularly, to systems and methods for improving the brightness of a transparent display using supplemental light sources that include ambient light collected by an array of Fresnel lenses.

BACKGROUND

Transparent displays are increasing in popularity in application environments such as vehicle windows and exterior building windows. One challenge in designing an effective transparent display is that such a display often competes with ambient light in the environment (e.g., sunlight), and the brightness of the transparent display ends up being weaker than desired. The power of the transparent display's light source (e.g., a light-emitting-diode (LED) light source) can be increased to compensate for the ambient light, but available power is limited in some application environments (e.g., in a vehicle), and boosting the LED power renders the transparent display system less efficient.

SUMMARY

An example of a system for improving the brightness of a transparent display is presented herein. The system comprises an array of Fresnel lenses disposed on an external surface of a vehicle to collect ambient light. The system also includes an adjustable transmission and reflection filter that controls how much light is collected as internal light from the headlights of the vehicle. The system also includes optical color filters to produce filtered ambient light from the ambient light and filtered internal light from the internal light, the filtered ambient light and the filtered internal light including red, green, and blue color components. The system also includes a processor and a light-emitting-diode (LED) light source that, under control of the processor, produces primary-source light by outputting, in a predetermined alternating manner, red, green, and blue light. The system also includes a memory storing machine-readable instructions that, when executed by the processor, cause the processor to control injection, into a transparent edge-lit liquid crystal waveguide display deployed in at least a portion of a window of the vehicle, the primary-source light, the filtered ambient light, and the filtered internal light. The red, green, and blue color components of the filtered ambient light and the filtered internal light are time-synchronized with the red, green, and blue light, respectively, of the primary-source light, and the filtered ambient light and the filtered internal light improve the brightness of the transparent edge-lit liquid crystal waveguide display.

Another embodiment is a non-transitory computer-readable medium for improving the brightness of a transparent display and storing instructions that, when executed by a processor, cause the processor to control injection, into a transparent edge-lit liquid crystal waveguide display deployed in at least a portion of a window of a vehicle, primary-source light, filtered ambient light, and filtered internal light. The primary-source light is generated using a light-emitting-diode (LED) light source that outputs, in a predetermined alternating manner, red, green, and blue light. Ambient light is collected using an array of Fresnel lenses disposed on an external surface of the vehicle. Internal light is collected from the headlights of the vehicle. The ambient light and the internal light are filtered to produce the filtered ambient light and the filtered internal light, the filtered ambient light and the filtered internal light including red, green, and blue color components. The red, green, and blue color components of the filtered ambient light and the filtered internal light are time-synchronized with the red, green, and blue light, respectively, of the primary-source light. The filtered ambient light and the filtered internal light improve the brightness of the transparent edge-lit liquid crystal waveguide display.

Another embodiment is a method of improving the brightness of a transparent display. The method includes collecting ambient light using an array of Fresnel lenses disposed on an external surface of a vehicle. The method also includes collecting internal light from the headlights of the vehicle. The method also includes filtering the ambient light and the internal light to produce filtered ambient light and filtered internal light, the filtered ambient light and the filtered internal light including red, green, and blue color components. The method also includes generating primary-source light using a light-emitting-diode (LED) light source that outputs, in a predetermined alternating manner, red, green, and blue light. The method also includes injecting, into a transparent edge-lit liquid crystal waveguide display deployed in at least a portion of a window of the vehicle, the primary-source light, the filtered ambient light, and the filtered internal light. The red, green, and blue color components of the filtered ambient light and the filtered internal light are time-synchronized with the red, green, and blue light, respectively, of the primary-source light, and the filtered ambient light and the filtered internal light improve the brightness of the transparent edge-lit liquid crystal waveguide display.

BRIEF DESCRIPTION OF THE DRAWINGS

So that the manner in which the above-recited features of the present disclosure can be understood in detail, a more particular description of the disclosure, briefly summarized above, may be had by reference to the implementations, some of which are illustrated in the appended drawings. It is to be noted, however, that the appended drawings illustrate only possible implementations of this disclosure and are therefore not to be considered limiting of its scope. The disclosure may admit to other implementations. Also, elements in the drawings are not necessarily drawn to scale.

To facilitate understanding, identical reference numerals have been used, wherever possible, to designate identical elements that are common to the figures. Additionally, elements of one or more embodiments may be advantageously adapted for utilization in other embodiments described herein.

DETAILED DESCRIPTION

In various embodiments described herein, the brightness of a transparent edge-lit liquid crystal waveguide display ("transparent display"), whether one-sided or dual-sided, is improved by supplementing the transparent display's light-emitting-diode (LED) light source with other light sources in the environment. For example, in various vehicular embodiments described herein, ambient light (e.g., sunlight) and internal light (e.g., light from the vehicle's headlights) are filtered and injected into the transparent display along with light from the LED light source in a color-synchronized manner to improve (i.e., increase) the brightness of the transparent display. In another embodiment, the brightness of a transparent display deployed in an exterior window of a building is improved by injecting into the transparent display filtered ambient light (e.g., sunlight) along with light from the LED light source in a color-synchronized manner.

In some embodiments, ambient light is collected using an array of Fresnel lenses. In other embodiments, the ambient light is collected using an array of metasurface lenses. In still other embodiments, the ambient light is collected using an array of diffraction gratings (narrow-bandwidth or broad-bandwidth). In some embodiments, the light collection subsystem that collects ambient light can be repositioned automatically to point toward an ambient light source (e.g., the sun).

Figure 1:
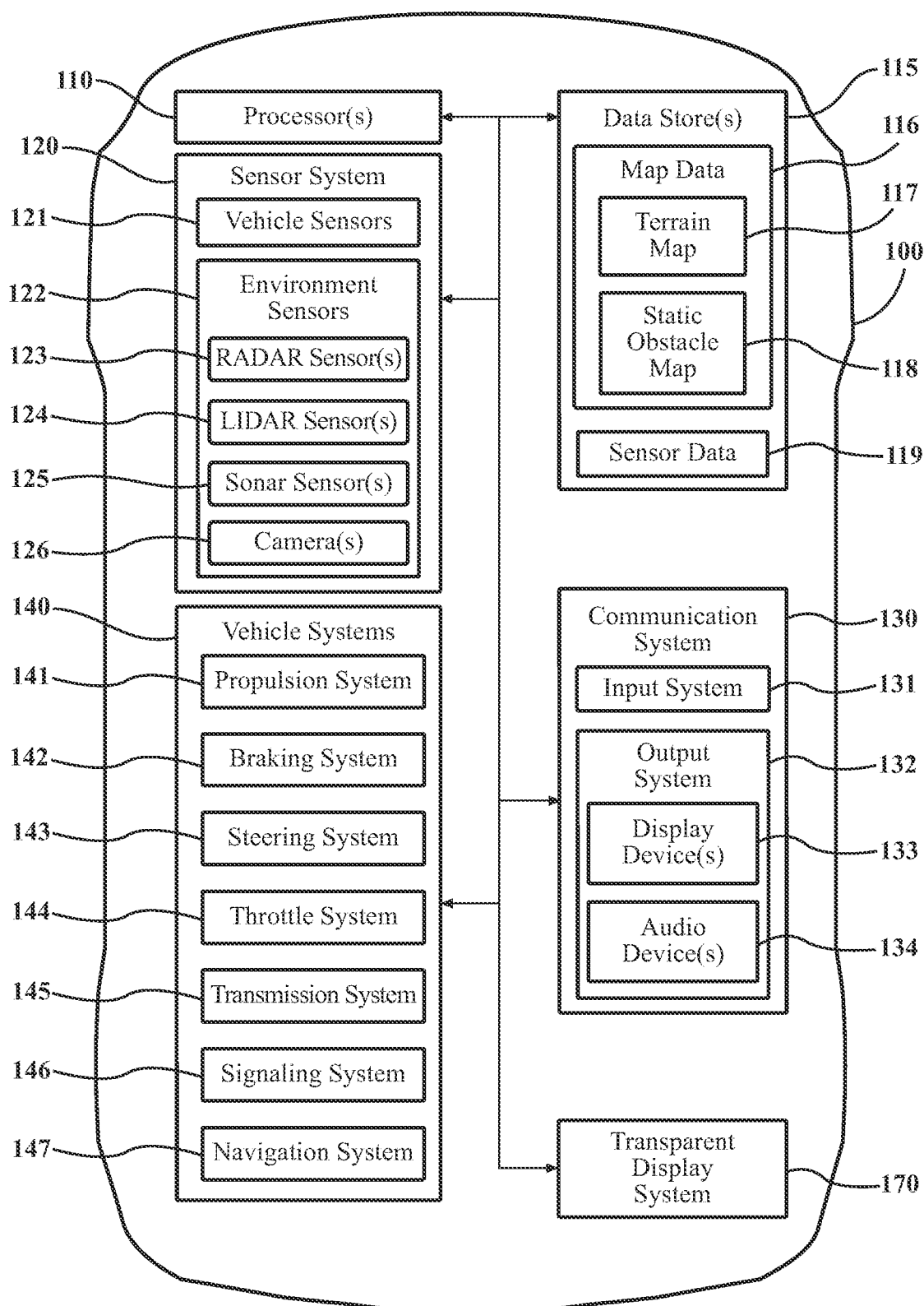
FIG. 1 illustrates one embodiment of a vehicle within which systems and methods disclosed herein may be implemented.

Referring to FIG. 1, an example of a vehicle 100, in which systems and methods disclosed herein can be implemented, is illustrated. As used herein, a "vehicle" is any form of motorized transport. For example, in some embodiments, the vehicle 100 is an automobile. The vehicle 100 can include a transparent display system 170 or capabilities to support or interact with the transparent display system 170 and thus benefits from the functionality discussed herein. Instances of vehicle 100, as used herein, are equally applicable to any device capable of incorporating the systems or methods described herein.

The vehicle 100 also includes various elements. It will be understood that, in various implementations, it may not be necessary for the vehicle 100 to have all of the elements shown in FIG. 1. The vehicle 100 can have any combination of the various elements shown in FIG. 1. Further, the vehicle 100 can have additional elements to those shown in FIG. 1. In some arrangements, the vehicle 100 may be implemented without one or more of the elements shown in FIG. 1, including transparent display system 170. While the various elements are shown as being located within the vehicle 100 in FIG. 1, it will be understood that one or more of these elements can be located external to the vehicle 100 or be part of a system that is separate from vehicle 100. Further, the elements shown may be physically separated by large distances.

Some of the possible elements of the vehicle 100 are shown in FIG. 1 and will be described in connection with subsequent figures. However, a description of many of the elements in FIG. 1 will be provided after the discussion of FIGS. 2-13 for purposes of brevity of this description. Additionally, it will be appreciated that for simplicity and clarity of illustration, where appropriate, reference numerals have been repeated among the different figures to indicate corresponding or analogous elements. In addition, the discussion outlines numerous specific details to provide a thorough understanding of the embodiments described herein. Those skilled in the art, however, will understand that the embodiments described herein may be practiced using various combinations of these elements.

As shown in FIG. 1, in some embodiments, vehicle 100 includes a sensor system 120. Sensor system 120 can include one or more vehicle sensors 121. Vehicle sensors 121 can include one or more positioning systems such as a dead-reckoning system or a global navigation satellite system (GNSS) such as a global positioning system (GPS). Vehicle sensors 121 can also include Controller-Area-Network (CAN) sensors that output, for example, speed and steering-angle data pertaining to vehicle 100. In some embodiments (e.g., embodiments in which vehicle 100 is an autonomous or semi-autonomous vehicle), vehicle 100 includes environment sensors 122 such as RADAR sensor(s) 123, Light Detection and Ranging (LIDAR) sensor(s) 124, sonar sensor(s) 125, and/or camera(s) 126.

As also shown in FIG. 1, vehicle 100 can include a communication system 130 that includes an input system 131 and an output system 132. As shown in FIG. 1, output system 132 includes display device(s) 133. Display device(s) 133 include a transparent display deployed in at least a portion of a window of vehicle 100. The window in which the transparent display is deployed can be a windshield, side window, or rear window, depending on the particular embodiment. In some embodiments, the transparent display is one-sided (single-sided). In other embodiments, the transparent display is dual-sided (i.e., capable of displaying different content on each of its two sides). In some embodiments, display device(s) 133 can include multiple transparent displays deployed in multiple vehicle windows and controlled by transparent display system 170. For simplicity in this description, the principles and techniques of the various vehicular embodiments are described below in terms of a single transparent display deployed in a vehicle 100.

The remainder of this Detailed Description is organized as follows. First, three different vehicular embodiments of a transparent display system are described in greater detail in connection with FIGS. 2-9. Second, a building-window embodiment is discussed in connection with FIGS. 10 and 11. Finally, the methods of the vehicular embodiments are summarized in connection with a discussion of FIG. 12, and the methods of the building-window embodiment are summarized in connection with a discussion of FIG. 13.

Vehicular Embodiments

Figure 2:
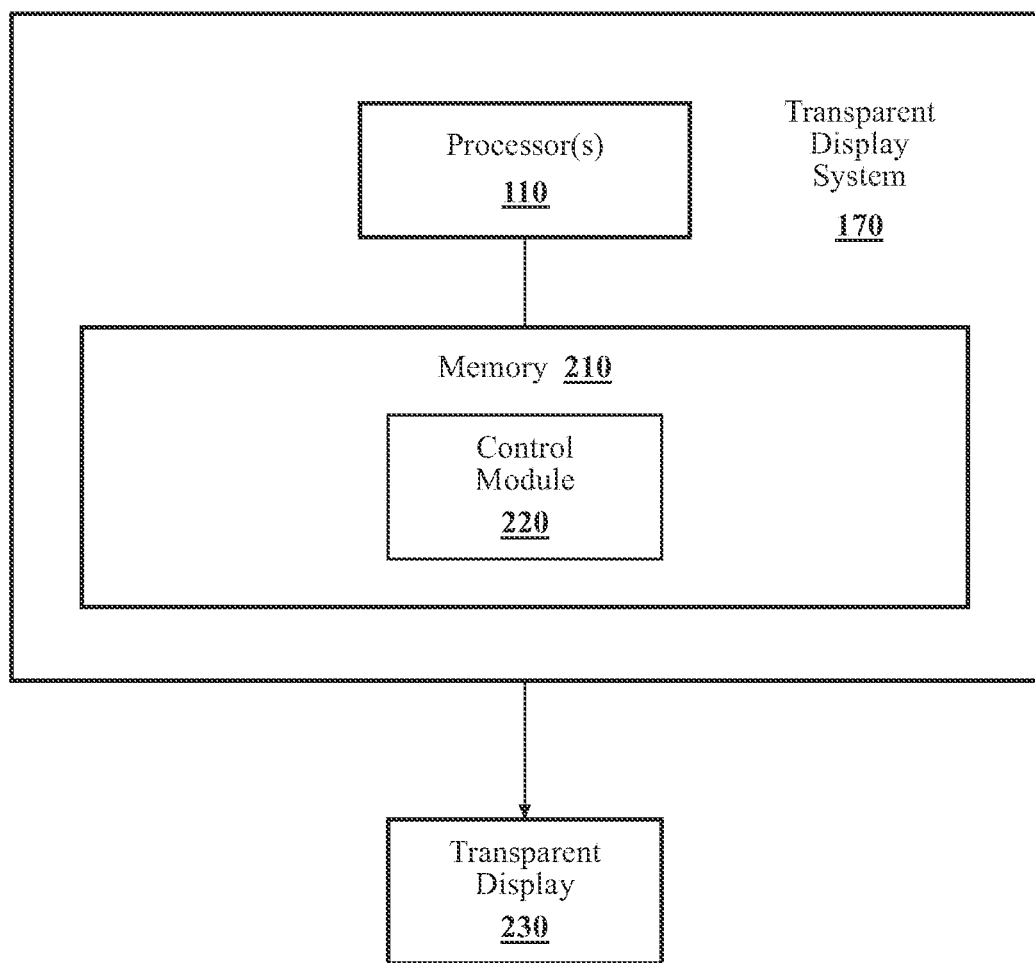
FIG. 2 is a block diagram of a transparent display system deployed in a vehicle, in accordance with illustrative embodiments of the invention.

FIG. 2 is a block diagram of a transparent display system 170, in accordance with illustrative embodiments of the invention. Transparent display system 170 is shown as including one or more processors 110 from the vehicle 100 of FIG. 1. Accordingly, one or more processors 110 may be a part of the transparent display system 170, the transparent display system 170 may include one or more processors that are separate from the one or more processors 110 of the vehicle 100, or the transparent display system 170 may access the one or more processors 110 through a data bus or another communication path.

In the embodiment of FIG. 2, the transparent display system 170 includes a memory 210 that stores a control module 220. The memory 210 is a random-access memory (RAM), read-only memory (ROM), a hard-disk drive, a flash memory, or other suitable memory for storing control module 220. The module 220 is, for example, machine-readable instructions that when executed by the one or more processors 110, cause the one or more processors 110 to perform the various functions disclosed herein.

As shown in FIG. 2, transparent display system 170 interfaces with a transparent display 230 deployed in a vehicle 100. As discussed above, transparent display 230 is an edge-lit liquid-crystal waveguide display that can be single-sided or dual-sided, depending on the embodiment. As those skilled in the art are aware, a display of this kind is made up of a plurality of layers, of which the waveguide is one layer. The transparent display 230 is a combination of glass, plastic, and electrodes in stacked layers with a liquid-crystal (LC) layer in the middle. As mentioned above, transparent display 230 can be deployed in at least a portion of one of the windows of vehicle 100—the windshield, a side window, or a rear window.

The primary light source on which transparent display 230 relies is a LED light source that, under control of the one or more processors 110, rapidly switches to output red (R), green (G), and blue (B) light in a repeating pattern at a rate higher than 60 Hz (e.g., R, G, B, R, G, B, R, G, B, etc.). Those skilled in the art sometimes refer to this process as color-sequential processing. As described further below, transparent display system 170 supplements the LED light source with other light sources in a color-synchronized manner consistent with the color-sequential processing just mentioned to improve the brightness of transparent display 230. Before summarizing the functions of control module 220, additional background for the vehicular embodiments is provided via a discussion of FIGS. 3-9.

Figure 3:
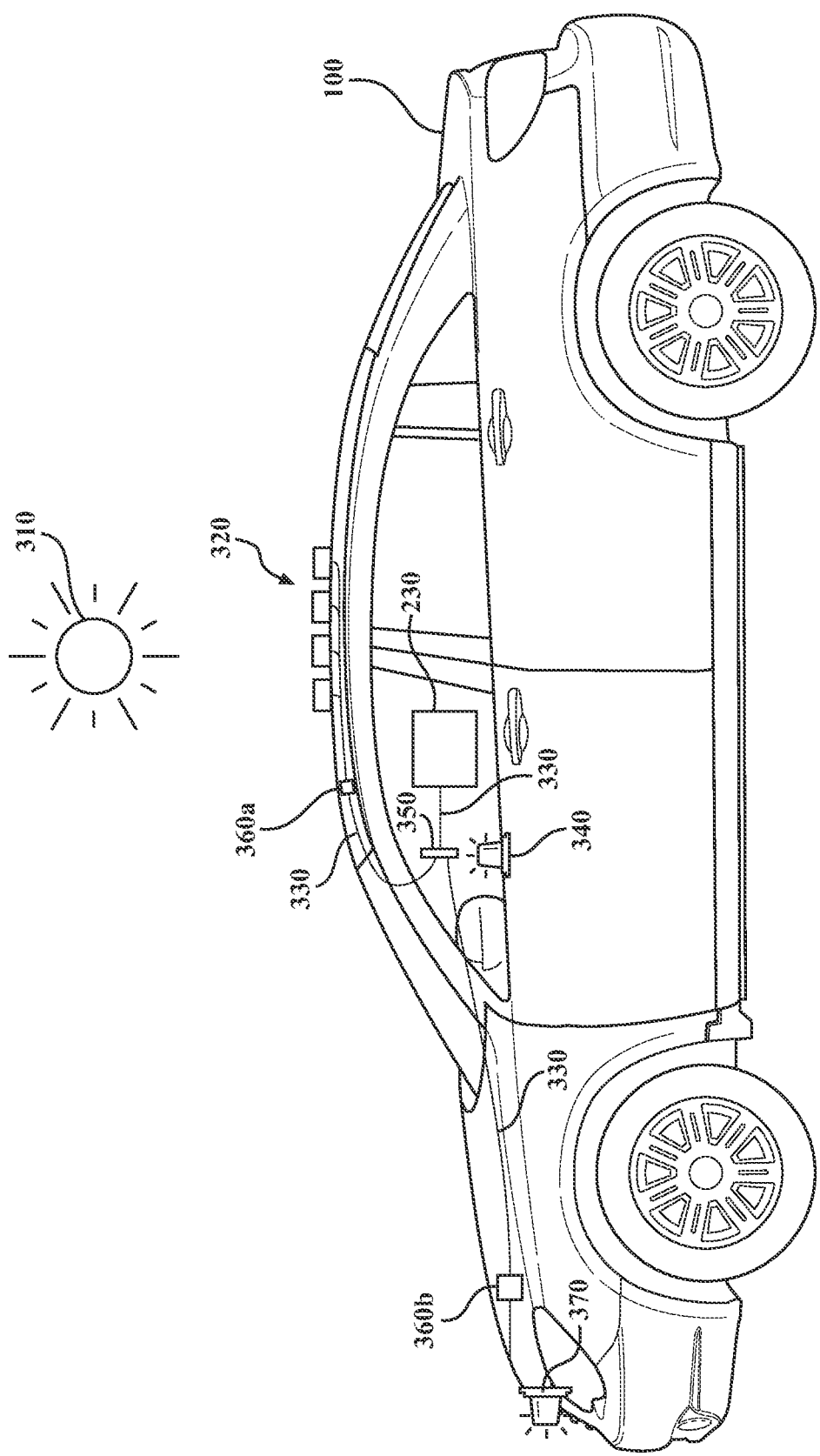
FIG. 3 illustrates vehicular embodiments of a transparent display system.

FIG. 3 illustrates vehicular embodiments of a transparent display system 170. In the embodiments of FIG. 3, a vehicle 100 includes a transparent display 230 that receives its primary-source light from LED light source 340. A light collection subsystem 320 disposed on an external surface of vehicle 100 collects ambient light 310 (e.g., sunlight) and channels it via a light pipe 330 (e.g., an optical fiber cable) to a set of color filters 360a. Color filters 360a produce R, G, and B color components (filtered ambient light) from the ambient light 310, and those color components are channeled to a light coupling component 350.

In the embodiments in FIG. 3, transparent display system 170 collects additional supplemental light from the headlights 370 of vehicle 100, particularly during the daytime, while the vehicle's headlights are activated. In this description, the light collected from the headlights 370 that supplements the LED light source 340 is referred to as "internal light." As shown in FIG. 3, the collected internal light is channeled via a light pipe 330 to another set of color filters 360b, which produces R, G, and B color components (filtered internal light) from the internal light. These color components are also channeled to light coupling component 350. In some embodiments, light coupling component 350 is connected with the transparent display 230 via a nonstandard light pipe rather than a typical optical-fiber cable.

Light coupling component 350 combines the three light sources (LED light source 340, filtered ambient light, and filtered internal light) so they can be injected into the transparent display 230. As mentioned above, this requires that the R, G, and B color components of the filtered ambient light and the filtered internal light be time-synchronized with the rapidly alternating R, G, and B light output by LED light source 340. This color switching and synchronization (color-sequential processing) is carried out under control of the one or more processors 110 as the one or more processors 110 execute the program instructions of control module 220. In some embodiments, the one or more processors 110 include a Graphics Processing Unit (GPU). In general, light coupling/switching among different light sources (primary, ambient, and internal) can be achieved via a micro-electromechanical system (MEMS) optical system, an integrated optical circuit, or a free-space optical system. Further, switching among the light sources can be controlled by the one or more processors 110, which can include one or more GPUs.

In some embodiments, the supplemental light sources (filtered ambient light and filtered internal light) are injected into the same edge of the transparent display 230 as the light produced by the LED light source 340. In other embodiments, the supplemental light sources are injected into a different edge of the transparent display 230 (e.g., the opposite edge). This design choice can influence whether source switching is needed.

The one or more processors 110 can control not only the switching of light coupling sources but can also handle the standard active-matrix controls of the transparent display 230. Examples of such controls include individual pixel switching and LED color changing, among other functions. In general, the one or more processors 110 can control whether supplemental light sources such as filtered ambient light and filtered internal light are enabled (turned on) and the ratio of primary-source light to supplemental light sources.

In some embodiments, the light collection subsystem 320 is disposed on the rooftop of vehicle 100, as shown in FIG. 3. In other embodiments, the light collection subsystem 320 (or multiple light collection subsystems 320) can be disposed on one or more of the pillars (A Pillar, B Pillar, etc.) of vehicle 100. One advantage of placing a light collection subsystem 320 on a pillar is that sunlight can be collected more efficiently when the sun as at an angle closer to the horizon without having to mechanically reposition a rooftop-based light collection subsystem 320. As discussed further below, in some embodiments, a light collection subsystem 320 can be disposed on an awning of vehicle 100 (e.g., a food truck that includes an awning).

Light collection subsystem 320 differs depending on the embodiment. For example, in some embodiments, light collection subsystem 320 includes an array of Fresnel lenses. In another embodiment, light collection subsystem 320 includes an array of metasurface lenses with a space plate. In yet another embodiment, light collection subsystem 320 includes an array of diffraction gratings. Each of these three embodiments is discussed in greater detail below. Regardless of which type of light-collection array is deployed, each element of such an array has an associated coupling element that couples the light collected by that array element with a light pipe 330 (e.g., a multi-mode optical fiber) that conveys the collected light to where it is needed in the transparent display system 170.

Figure 4A:
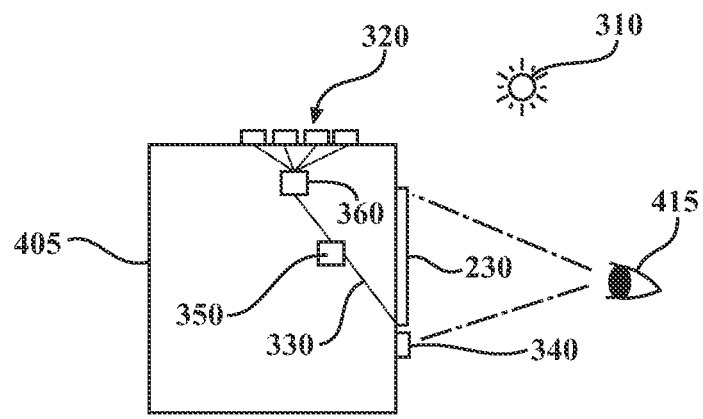
FIGS. 4A and 4B illustrate an application environment in which a light collection subsystem can be repositioned automatically to point toward the sun, in accordance with illustrative embodiments of the invention.
Figure 4B:
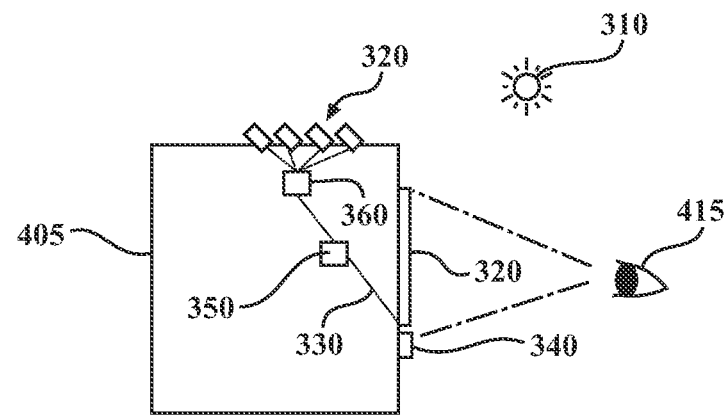

FIGS. 4A and 4B illustrate an application environment 405 (e.g., a vehicle or building) in which a light collection subsystem 320 can be repositioned automatically to point toward the sun, in accordance with illustrative embodiments of the invention. In FIGS. 4A and 4B, a light collection subsystem 320 is disposed on an exterior surface of the application environment 405. In this embodiment, transparent display system 170 includes sensors and logic (e.g., program instructions) to detect the direction from which the ambient light 310 (e.g., sunlight) is shining on the application environment 405. Light collection subsystem 320 is mounted in such a way that its position can be adjusted to point in the detected direction to make the collection of ambient light 310 more efficient. This repositioning of light collection subsystem 320 (tilting it toward the sun) is illustrated in FIG. 4B. In FIGS. 4A and 4B, the eye symbol represents a person viewing the transparent display 230. Techniques for automatically detecting the direction from which the sun is shining and adjusting the position of a light collection subsystem 320 to point in that direction are known in the art. For example, see U.S. Pat. No. 11,431,286 B2, "Solar Cell Assemblies Exhibiting Artificial Tropism," to Severgnini et al. and assigned to Toyota Motor Engineering & Manufacturing North America, Inc., Aug. 30, 2022.

Figure 4C:
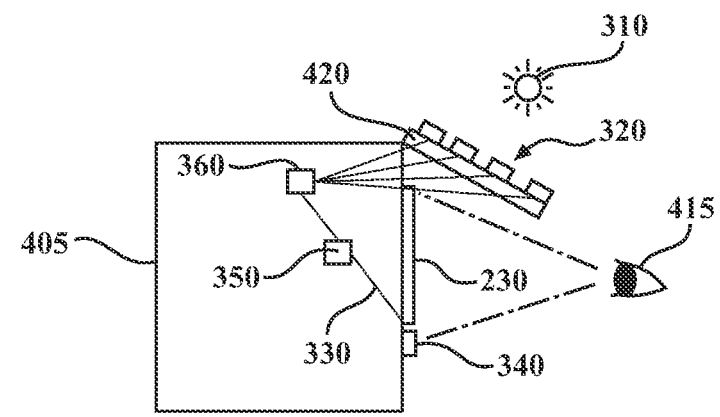
FIG. 4C illustrates an embodiment in which an application environment such as a vehicle or building includes an awning on which a light collection subsystem is disposed.

FIG. 4C illustrates an embodiment in which an application environment such as a vehicle or building includes an awning 420 on which a light collection subsystem 320 is disposed. As illustrated in FIG. 4C, the angled awning 420 can aid in positioning the light collection subsystem 320 in a way that supports more efficient collection of sunlight (ambient light 310). As mentioned above, in one embodiment vehicle 100 is a food truck that includes an awning 420. While the food truck is parked and a transparent display 230 in a side window of the vehicle is in use, the awning 420 along the applicable side of vehicle 100 can be deployed. The awning 420 provides the additional advantage that transparent display 230 is shaded somewhat by the awning 420, further improving the apparent brightness of the transparent display 230.

Figure 5A:
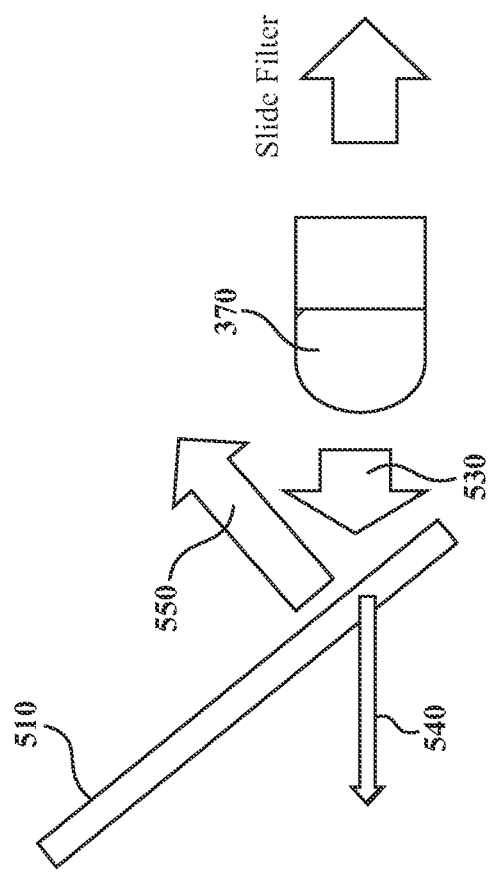
FIGS. 5A and 5B illustrate collecting internal light from vehicle headlights, in accordance with illustrative embodiments of the invention.
Figure 5B:
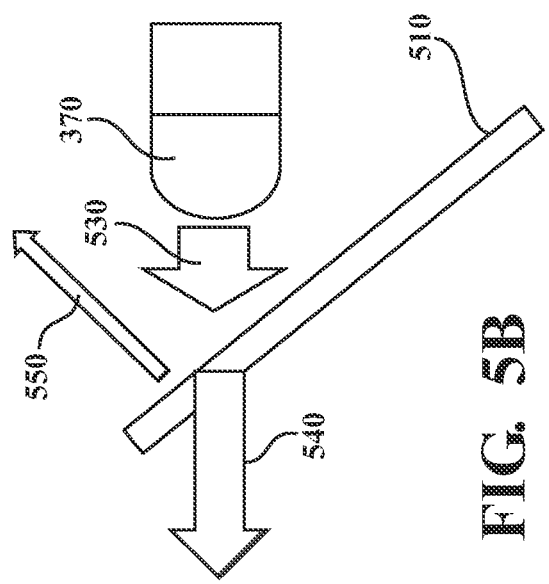

FIGS. 5A and 5B illustrate collecting internal light from vehicle headlights 370, in accordance with illustrative embodiments of the invention. In various embodiments, a transmission and reflection filter 510 controls how much internal light 530 from headlights 370 is transmitted forward (toward the roadway) (540) and how much light is reflected back (550) to serve as supplemental internal light for a transparent display 230. Conceptually, in FIGS. 5A and 5B, transmission and reflection filter 510 may be thought of as a sliding member with spatially varying transmissivity/reflectivity along its length that can be repositioned to control the ratio of transmitted light (540) to reflected light (550). For example, in FIG. 5A, the filter is positioned, during the daytime, to reflect more internal light (550) to support transparent display 230. In FIG. 5B, the filter is positioned, during nighttime, to transmit more light (540) and to reflect less light (550) in support of transparent display 230. Transparent display 230 requires less supplemental light at night because transparent display 230 is not competing with as much ambient light 310 as during the daytime. In some vehicular embodiments, when little or no ambient light 310 is available (i.e., during nighttime), transparent display system 170 can still improve the brightness of a transparent display 230 using only internal light collected from the vehicle's headlights 370 to supplement the primary LED light source 340. Again, the transmission and reflection filter 510 depicted in FIGS. 5A and 5B is merely conceptual for the purposes of explanation. In practice, a transmission and reflection filter 510 can be used that does not require any mechanical repositioning to adjust transmissivity/reflectivity. Instead, a transmission and reflection filter 510 that can be controlled by control module 220 via the one or more processors 110 can be used.

Figure 6:
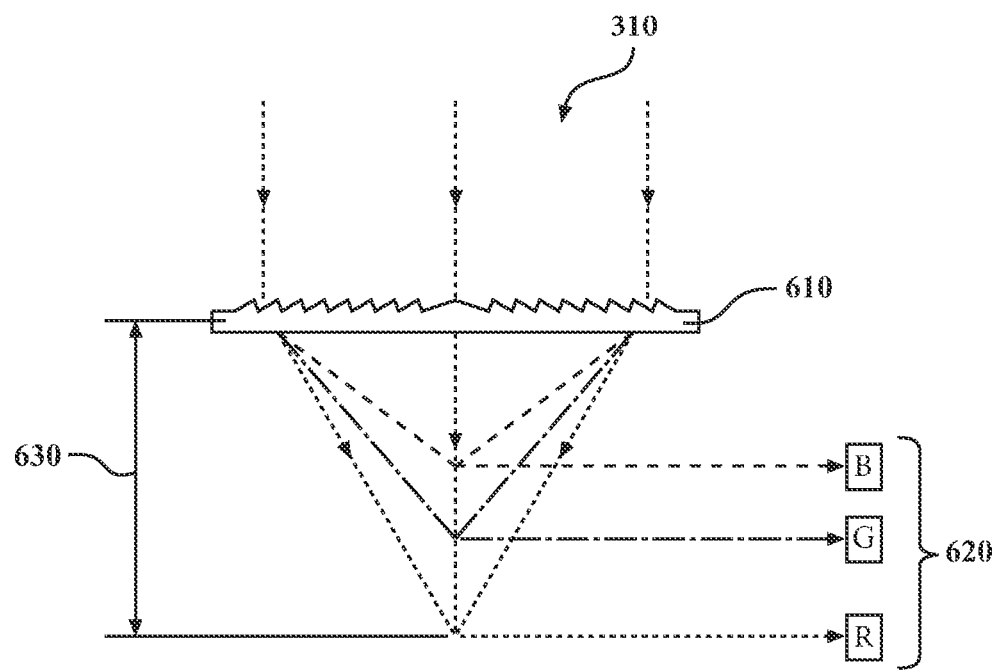
FIG. 6 illustrates wavelength separation of light by a Fresnel lens to produce red, green, and blue color components, in accordance with an illustrative embodiment of the invention.

FIG. 6 illustrates wavelength separation of ambient light 310 by a Fresnel lens 610 to produce red (R), green (G), and blue (B) color components 620, in accordance with an illustrative embodiment of the invention. FIG. 6 pertains to embodiments in which light collection subsystem 320 includes an array of Fresnel lenses, each with a focal length 630. As illustrated in FIG. 6, a Fresnel lens 610 is capable of separating ambient light 310 that enters it into the R, G, and B color components 620. In some embodiments, a space plate is disposed beneath the Fresnel lens 610 (and other similar lenses in the array) to facilitate this wavelength separation. Thus, in such an embodiment, the Fresnel lenses in the array of Fresnel lenses act as the optical color filters 360a for the ambient light 310, eliminating the need for the separate optical color filters 360a shown in FIG. 3.

Figure 7:
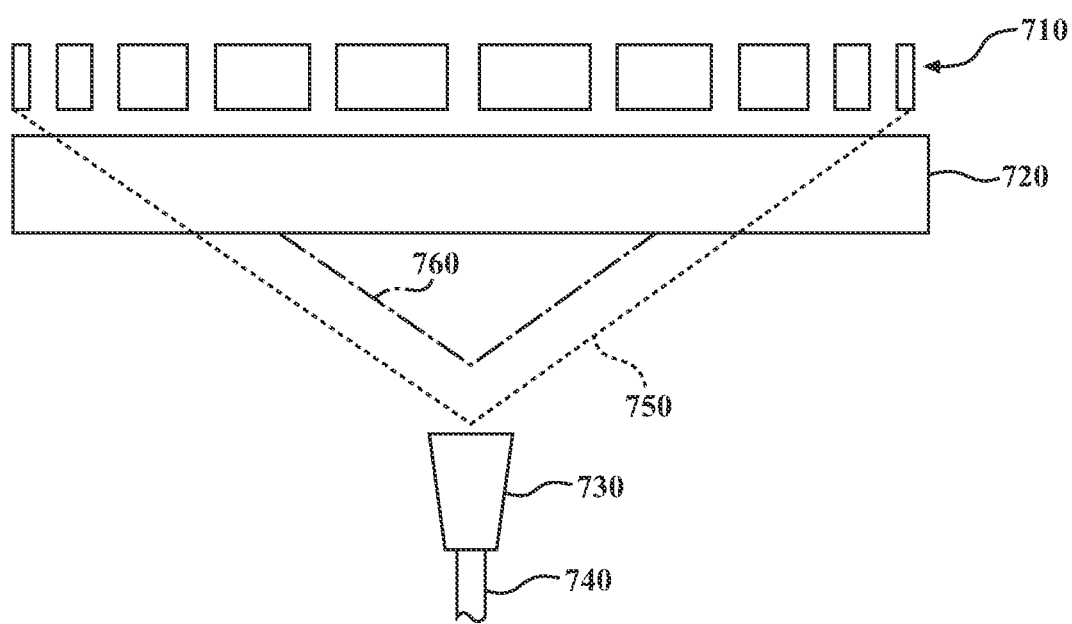
FIG. 7 illustrates an array of metasurface lenses, a space plate, and related components, in accordance with an illustrative embodiment of the invention.

FIG. 7 illustrates an array of metasurface lenses 710, a space plate 720, and related components, in accordance with an illustrative embodiment of the invention. As discussed above, in some embodiments light collection subsystem 320 includes an array of metasurface lenses 710. As those skilled in the art are aware, metasurface lenses are constructed by modifying the refractive index of materials at the nanoscale. Such metasurface lenses can directly change the properties of light, such as phase, amplitude, and polarization. As shown in FIG. 7, space plate 720 provides for a more compact (space-efficient) coupling of collected ambient light 310 via light coupler 730 so the collected ambient light 310 can be channeled (directed) via fiber optic cable 740. FIG. 7 compares the light rays without space plate 720 (750 in FIG. 7) with the light rays with space plate 720 (760 in FIG. 7). The space plate 720 thus reduces the distance of the focal plane for the array of metasurface lenses 710 so the light coupler 730 can be positioned closer to the array of metasurface lenses 710.

Figure 8:
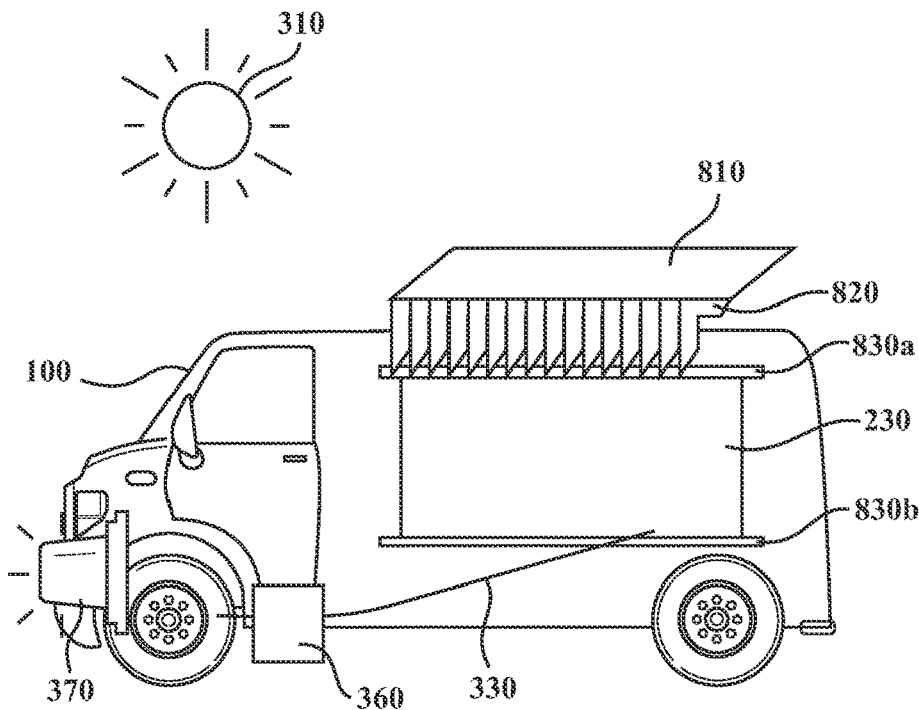
FIG. 8 illustrates another vehicular embodiment of a transparent display system.

FIG. 8 illustrates another vehicular embodiment of a transparent display system 170. The embodiment of FIG. 8 is similar to the embodiments depicted in FIG. 3 but with some differences. As discussed above, in the embodiment of FIG. 8, light collection subsystem 320 includes an array of diffraction gratings 810. The ambient light 310 (e.g., sunlight) collected by the array of diffraction gratings 810 is coupled to the other components of transparent display system 170 via a set of light pipe elbows 820. In this embodiment, the primary light source for the transparent display 230 is a pair of LED strip light sources 830 (LED strip light source 830a and LED strip light source 830b) along the top and bottom edges of the transparent display 230. In the embodiment of FIG. 8, internal light is collected from the vehicle's headlights 370 and filtered to produce R, G, and B color components by a set of color filters 360, as discussed above.

Figure 9:
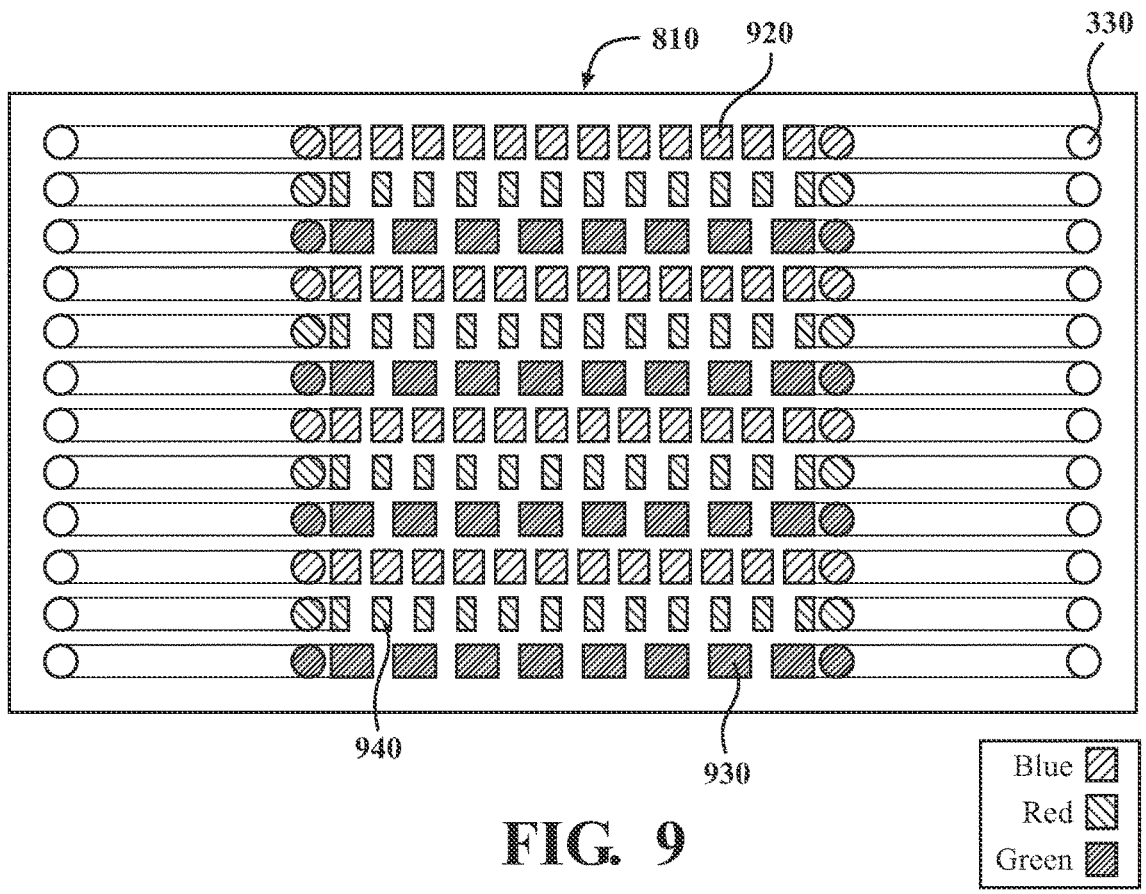
FIG. 9 illustrates an array of diffraction gratings, in accordance with an illustrative embodiment of the invention.

FIG. 9 illustrates an array of diffraction gratings 810, in accordance with an illustrative embodiment of the invention. In the embodiment of FIG. 8 discussed above, the array of diffraction gratings 810 can produce the R, G, and B color components from the collected ambient light 310, obviating the need for separate optical color filters 360. In such an embodiment, the array of diffraction gratings 810 includes color-specific (narrow-bandwidth) diffraction gratings for R (940), G (930), and B (920). In addition, as those skilled in the art are aware, rather than using narrow-band filters, it is possible to use an even wider spectrum of light by knowing the total power for a given range of wavelengths and allowing them to pass into the display for a predetermined period of time. As shown in FIG. 9, the diffraction gratings are coupled with a set of light pipes 330 that channel the collected light. In a different embodiment, the array of diffraction gratings 810 includes broad-bandwidth diffraction gratings, and separate optical color filters 360 are used to produce the R, G, and B color components, as discussed above (see optical color filters 360a in FIG. 3).

Referring again to FIG. 2, control module 220 generally includes machine-readable instructions that, when executed by the one or more processors 110, cause the one or more processors 110 to control injection, into a transparent display 230 deployed in at least a portion of a window of a vehicle 100, the primary-source light from LED light source 340, the filtered ambient light, and the filtered internal light. As explained above, the R, G, and B color components of the filtered ambient light and the filtered internal light are time-synchronized with the R, G, and B light, respectively, of the primary-source light. As also explained above, the filtered ambient light and the filtered internal light improve (increase) the brightness of the transparent display 230.

As discussed above, how the light collection subsystem 320 is implemented and whether separate optical color filters 360 are needed to produce the R, G, and B color components differs, depending on the embodiment.

In some embodiments, the transparent display 230 is implemented as a touch screen system. For example, certain aspects of the user interface of vehicle 100 (e.g., access to the vehicle) can be handled via a touch-screen-based transparent display 230 deployed in one of the vehicle's windows.

Building-Window Embodiments

Figure 10:
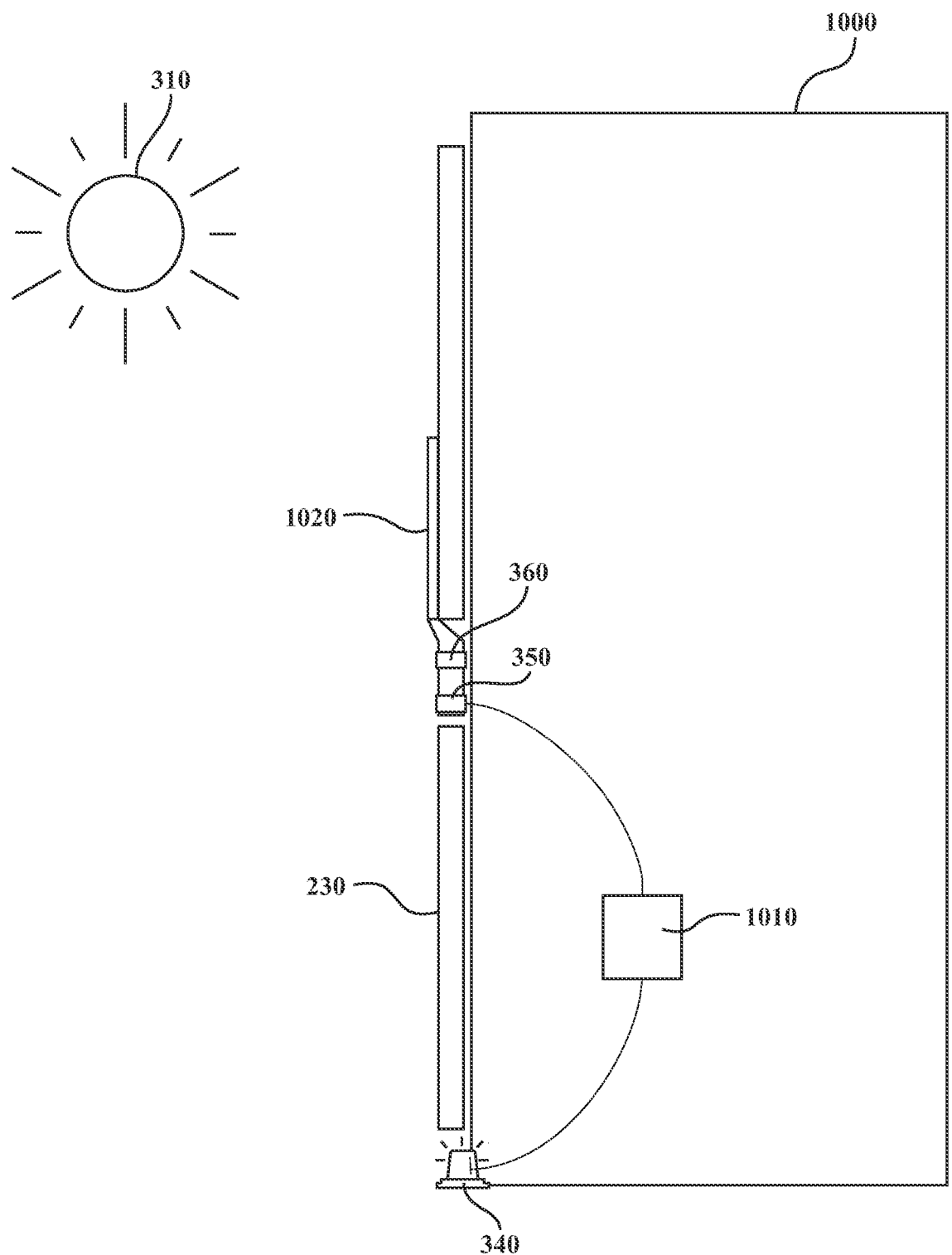
FIG. 10 illustrates a building-window embodiment of a transparent display system.

FIG. 10 illustrates a building-window embodiment of a transparent display system. Many of the same principles (color synchronization, etc.) discussed above in connection with the vehicular embodiments also apply to the building-window embodiment of FIG. 10. As shown in FIG. 10, a transparent display 230 is deployed in at least a portion of a window of a building 1000. As in the vehicular embodiments discussed above, the primary light source for the transparent display 230 is a LED light source 340. An array of diffraction gratings 1020 (e.g., broad-bandwidth diffraction gratings) disposed on an external surface of the building 1000 collects ambient light 310 (e.g., sunlight), and the collected ambient light is channeled to optical color filters 360 to produce R, G, and B color components, as discussed above. In some embodiments, narrow-bandwidth diffraction gratings can be used to eliminate the need for separate optical color filters 360, as discussed above in connection with the vehicular embodiment of FIG. 9. The filtered ambient light can be injected into transparent display 230 via a light coupling component 350. As explained above, the R, G, and B color components of the filtered ambient light are time-synchronized, via a controller 1010 (e.g., a GPU or other processor(s)), with the corresponding R, G, and B light output by the LED light source 340. The result is that the filtered ambient light improves the brightness of the transparent display 230. In some embodiments, the array of diffraction gratings 1020 can be implemented as a thin-film coating or as a nanoparticle coating.

In some embodiments, the array of diffraction gratings 1020 is disposed on another window of the building 1000 (a window other than the one in which the transparent display 230 is deployed). In other embodiments, the array of diffraction gratings 1020 is disposed on a space between the window in which transparent display 230 is deployed and another window of the building 1000. In yet another embodiment, the array of diffraction gratings 1020 is disposed on an awning 420 of the building 1000 that is positioned above an exterior building window in which a transparent display 230 is deployed (see FIG. 4C). As in a vehicular (e.g., food-truck) embodiment, the awning 420 provides the additional advantage that transparent display 230 is shaded somewhat by the awning 420, further improving the apparent brightness of the transparent display 230.

As in the vehicular embodiments discussed above, the transparent display 230 in the building-window embodiment of FIG. 10 can be single-sided or dual-sided. Also, in some embodiments, the transparent display 230 can be implemented as a touch screen display.

Figure 11:
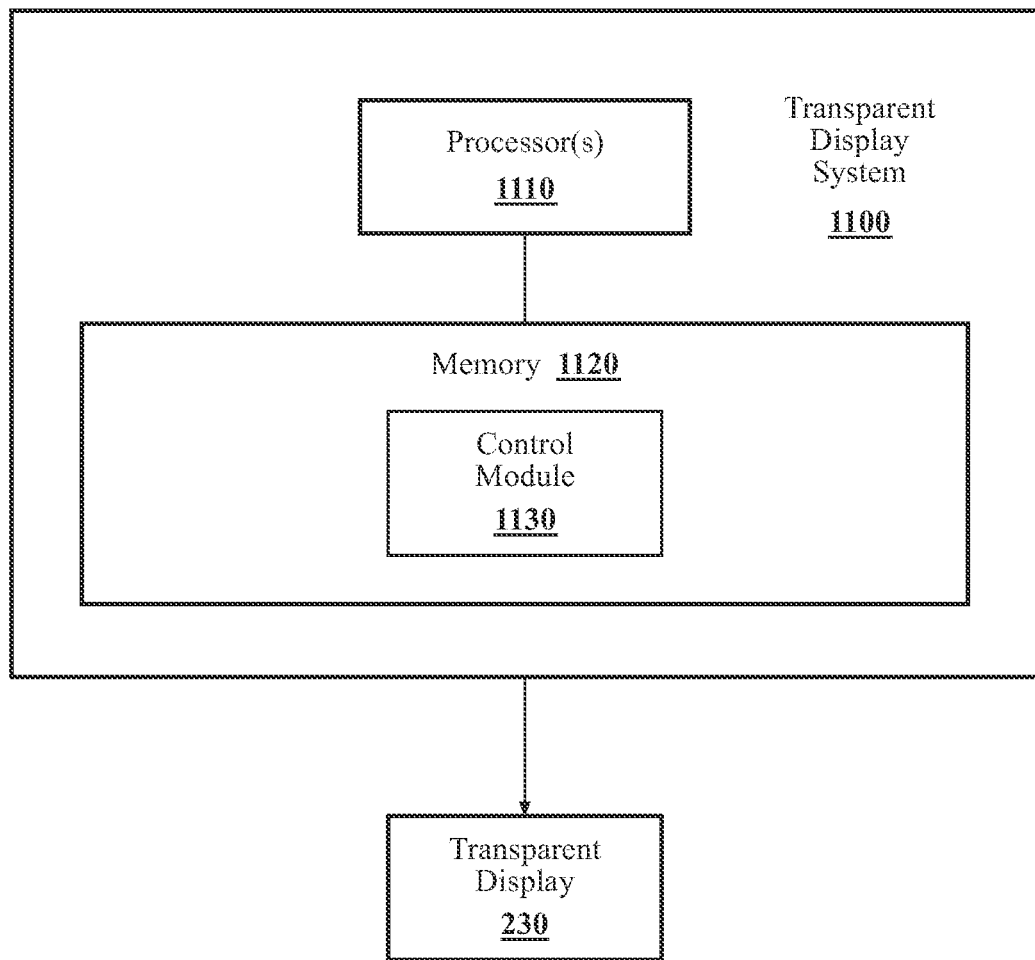
FIG. 11 is a block diagram of a transparent display system deployed in a window of a building, in accordance with an illustrative embodiment of the invention.

FIG. 11 is a block diagram of a transparent display system 1100 deployed in a window of a building 1000, in accordance with an illustrative embodiment of the invention. Transparent display system 1100 is shown as including one or more processors 1110. In some embodiments, the one or more processors 1110 include one or more GPUs.

In the building-window embodiment of FIG. 11, the transparent display system 1100 includes a memory 1120 that stores a control module 1130. The memory 1120 is a random-access memory (RAM), read-only memory (ROM), a hard-disk drive, a flash memory, or other suitable memory for storing control module 1130. The module 1130 is, for example, machine-readable instructions that when executed by the one or more processors 1110, cause the one or more processors 1110 to perform the various functions disclosed herein.

As shown in FIG. 11, transparent display system 1100 interfaces with a transparent display 230 deployed in a window of a building 1000, as discussed above in connection with FIG. 10. As discussed above in connection with the vehicular embodiments, transparent display 230 is an edge-lit liquid-crystal waveguide display that can be single-sided or dual-sided, depending on the embodiment. As those skilled in the art are aware, a display of this kind is made up of a plurality of layers, of which the waveguide is one layer. The transparent display 230 is a combination of glass, plastic, and electrodes in stacked layers with a LC layer in the middle. The primary light source on which transparent display 230 relies is a LED light source 340 that, under control of the one or more processors 1110, rapidly switches to output R, G, and B light in a repeating pattern at a rate higher than 60 Hz (e.g., R, G, B, R, G, B, R, G, B, etc.). As discussed above, those skilled in the art sometimes refer to this arrangement as color-sequential processing. As described above in connection with the vehicular embodiments and FIG. 10, transparent display system 1100 supplements the LED light source 340 with filtered ambient light in a color-synchronized manner consistent with the color-sequential processing controlled by the one or more processors 1110 to improve the brightness of transparent display 230.

Control module 1130 generally includes machine-readable instructions that, when executed by the one or more processors 1110, cause the one or more processors 1110 to control injection, into a transparent display 230 deployed in at least a portion of a window of the building 1000, the primary-source light from LED light source 340 and the filtered ambient light. As discussed above, the R, G, and B color components of the filtered ambient light are time-synchronized with the corresponding R, G, and B light, respectively, of the primary-source light. As also discussed above, the injected filtered ambient light improves the brightness of the transparent display 230.

Methods of the Various Embodiments

Figure 12:
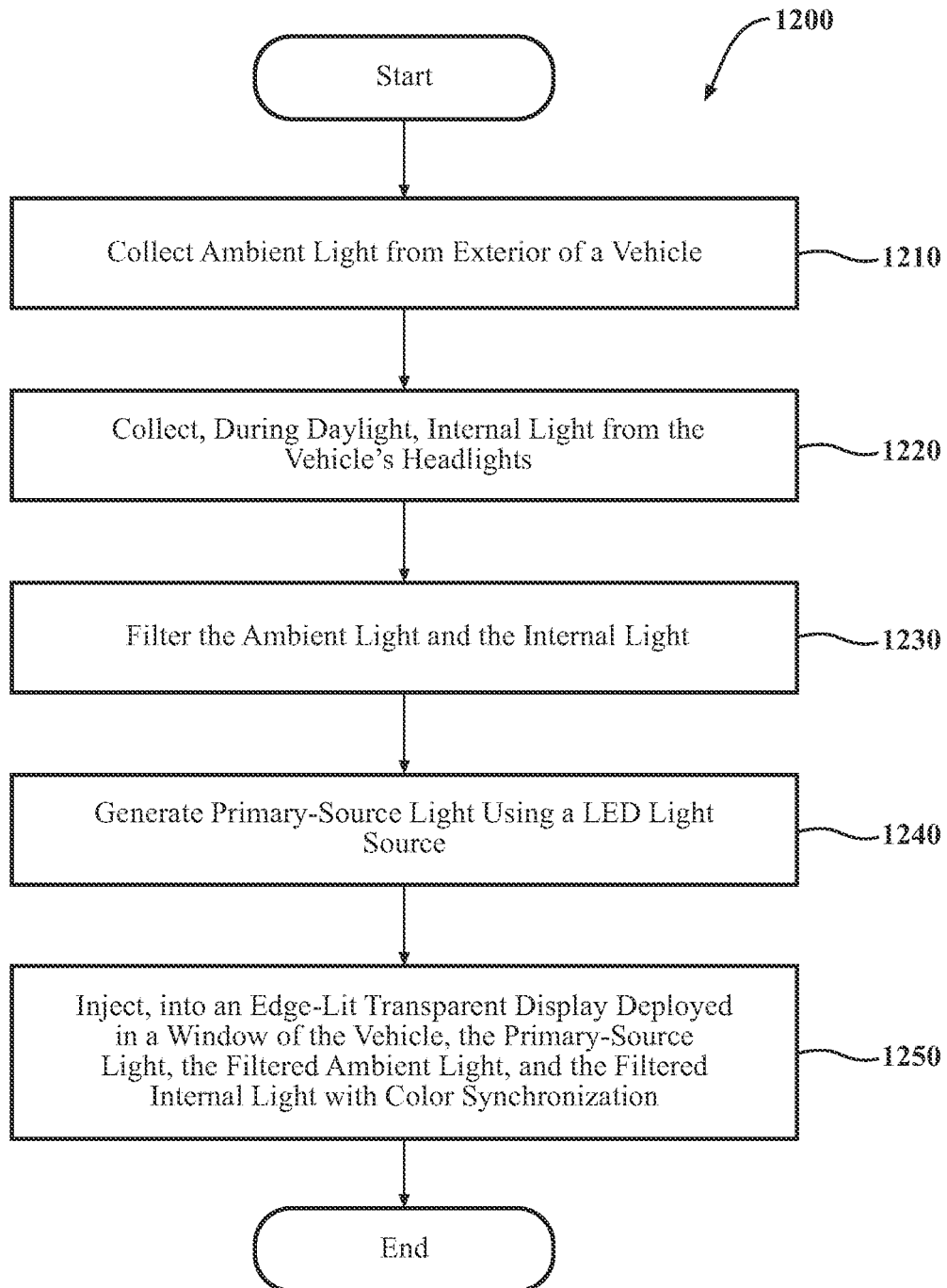
FIG. 12 is a flowchart of a method of improving the brightness of a transparent display, in accordance with illustrative vehicular embodiments of the invention.

FIG. 12 is a flowchart of a method 1200 of improving the brightness of a transparent display 230, in accordance with illustrative vehicular embodiments of the invention. Method 1200 will be discussed from the perspective of the transparent display system 170 shown in FIG. 2. While method 1200 is discussed in combination with transparent display system 170, it should be appreciated that method 1200 is not limited to being implemented within transparent display system 170, but transparent display system 170 is instead one example of a system that may implement method 1200.

At block 1210, transparent display system 170 collects ambient light 310 (e.g., sunlight) using a light collection subsystem 320 disposed on an external surface of a vehicle 100. As discussed above, in some embodiments, light collection subsystem 320 includes an array of Fresnel lenses. In other embodiments, light collection subsystem 320 includes an array of metasurface lenses. In still other embodiments, light collection subsystem 320 includes an array of diffraction gratings. The diffraction gratings can be narrow-bandwidth or broad-bandwidth, depending on the embodiment.

At block 1220, transparent display system 170 collects internal light from headlights 370 of the vehicle 100. This is discussed above in connection with FIGS. 5A and 5B. A transmission and reflection filter 510 can be used to control how much internal light from the headlights 370 is transmitted vs. how much is reflected and channeled to support the transparent display 230. Also, in some embodiments, the brightness of the transparent display 230 can be improved at nighttime through supplemental internal light from the headlights 370 only, when little or no ambient light 310 is available.

At block 1230, the ambient light and the internal light are filtered to produce filtered ambient light and filtered internal light. As explained above, the filtered ambient light and the filtered internal light each include R, G, and B color components. In some embodiments, the function of optical color filters 360a (see FIG. 3) for the ambient light 310 can be accomplished by the array of Fresnel lenses or the array of diffraction gratings itself, as discussed above, which obviates the need for separate optical color filters 360a.

At block 1240, LED light source 340 generates primary-source light by outputting, in a predetermined alternating manner in rapid succession, R, G, and B light. As discussed above, LED light source 340 outputs, under control of the one or more processors 110, R, G, and B light in a repeating pattern at a rate higher than 60 Hz (e.g., R, G, B, R, G, B, R, G, B, etc.).

At block 1250, control module 220 causes the one or more processors 110 to inject, into a transparent display 230 deployed in at least a portion of a window of the vehicle 100, the primary-source light, the filtered ambient light, and the filtered internal light. The R, G, and B color components of the filtered ambient light and the filtered internal light are time-synchronized with the R, G, and B light, respectively, of the primary-source light. As explained above, the injected filtered ambient light and the injected filtered internal light improve the brightness of the transparent display 230.

In some embodiments, method 1200 also includes automatically detecting the direction from which sunlight is shining on the vehicle 100 and adjusting the light collection subsystem 320 (e.g., the array of Fresnel lenses, array of metasurface lenses, or array of diffraction gratings) to face toward the detected direction, as discussed above.

Figure 13:
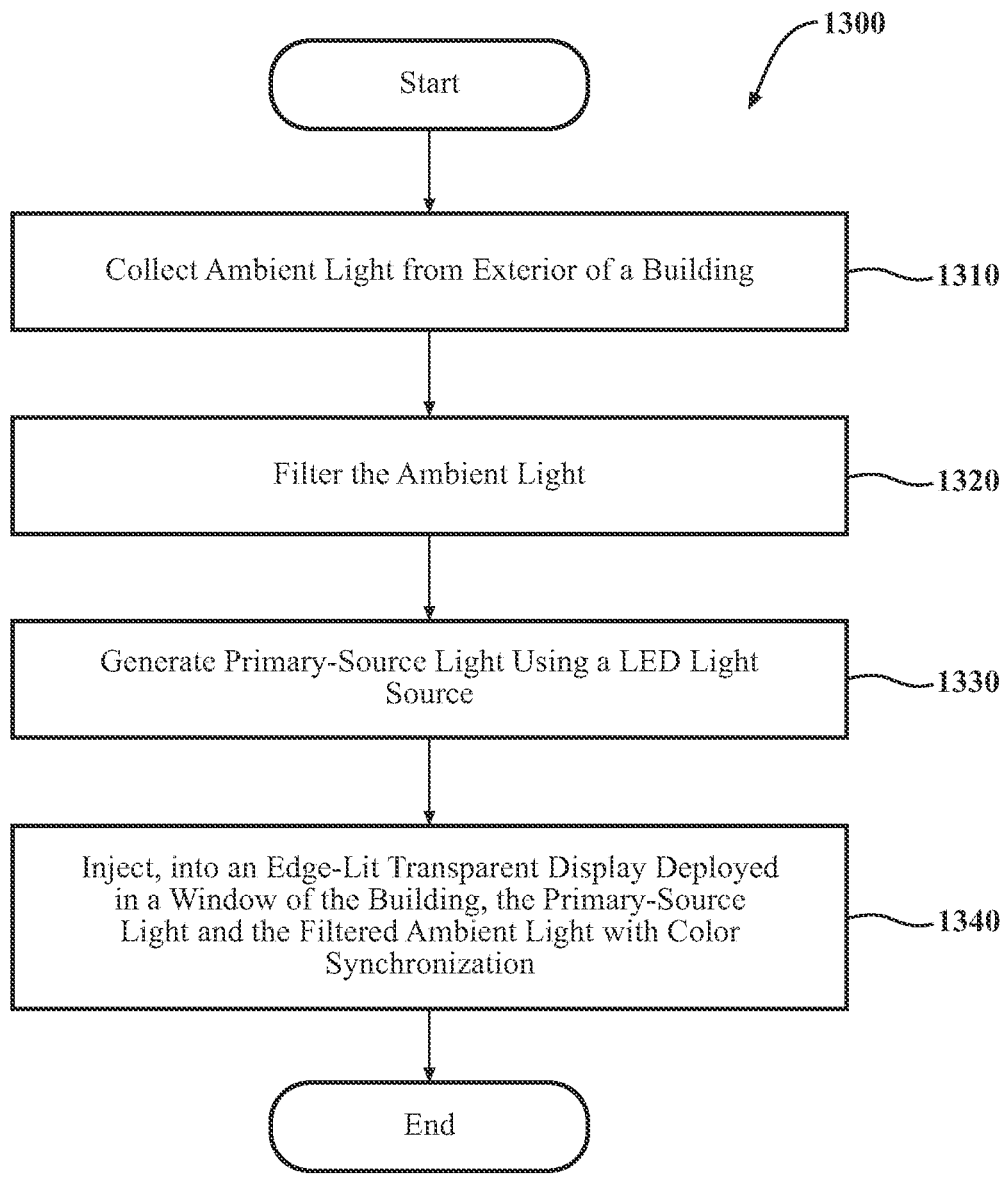
FIG. 13 is a flowchart of a method of improving the brightness of a transparent display, in accordance with an illustrative building-window embodiment of the invention.

FIG. 13 is a flowchart of a method 1300 of improving the brightness of a transparent display 230, in accordance with an illustrative building-window embodiment of the invention. Method 1300 will be discussed from the perspective of the transparent display system 1100 shown in FIG. 11. While method 1300 is discussed in combination with transparent display system 1100, it should be appreciated that method 1300 is not limited to being implemented within transparent display system 1100, but transparent display system 1100 is instead one example of a system that may implement method 1300.

At block 1310, transparent display system 1100 collects ambient light 310 (e.g., sunlight) using an array of diffraction gratings 1020 disposed on an external surface of a building 1000. As discussed above, in some embodiments, the array of diffraction gratings 1020 is disposed on another window of the building 1000 (a window other than the one in which the transparent display 230 is deployed). In other embodiments, the array of diffraction gratings 1020 is disposed on a space between the window in which transparent display 230 is deployed and another window of the building 1000. In still other embodiments, the array of diffraction gratings 1020 is disposed on an awning 420 that is positioned above the building window in which the transparent display 230 is deployed.

At block 1320, the ambient light 310 is filtered to produce filtered ambient light, the filtered ambient light including R, G, and B color components. As discussed above, in some embodiments the ambient light is filtered using a set of optical color filters 360 separate from the array of diffraction gratings 1020. In those embodiments, the diffraction gratings are of the broad-bandwidth type. In other embodiments, the diffraction gratings are of a narrow-bandwidth type that can produce the R, G, and B color components (see the discussion of the vehicular embodiment of FIG. 9 above).

At block 1330, LED light source 340 generates primary-source light by outputting, in a predetermined alternating manner in rapid succession, R, G, and B light. As discussed above, LED light source 340 outputs, under control of the one or more processors 1110, R, G, and B light in a repeating pattern at a rate higher than 60 Hz (e.g., R, G, B, R, G, B, R, G, B, etc.).

At block 1340, control module 1130 causes the one or more processors 1110 to inject, into a transparent display 230 deployed in at least a portion of a window of the building 1000, the primary-source light and the filtered ambient light. As discussed above, the R, G, and B color components of the filtered ambient light are time-synchronized with the corresponding R, G, and B light, respectively, of the primary-source light. As also discussed above, the filtered ambient light improves the brightness of the transparent display 230.

FIG. 1 will now be discussed in full detail as an example vehicle environment within which the systems and methods disclosed herein may be implemented. The vehicle 100 can include one or more processors 110. In one or more arrangements, the one or more processors 110 can be a main processor of the vehicle 100. For instance, the one or more processors 110 can be an electronic control unit (ECU). The vehicle 100 can include one or more data stores 115 for storing one or more types of data. The data store(s) 115 can include volatile and/or non-volatile memory. Examples of suitable data stores 115 include RAM, flash memory, ROM, PROM (Programmable Read-Only Memory), EPROM, EEPROM (Electrically Erasable Programmable Read-Only Memory), registers, magnetic disks, optical disks, hard drives, or any other suitable storage medium, or any combination thereof. The data store(s) 115 can be a component(s) of the one or more processors 110, or the data store(s) 115 can be operatively connected to the one or more processors 110 for use thereby. The term "operatively connected," as used throughout this description, can include direct or indirect connections, including connections without direct physical contact.

In one or more arrangements, the one or more data stores 115 can include map data 116. The map data 116 can include maps of one or more geographic areas. In some instances, the map data 116 can include information or data on roads, traffic control devices, road markings, structures, features, and/or landmarks in the one or more geographic areas. In one or more arrangement, the map data 116 can include one or more terrain maps 117. The terrain map(s) 117 can include information about the ground, terrain, roads, surfaces, and/or other features of one or more geographic areas. In one or more arrangement, the map data 116 can include one or more static obstacle maps 118. The static obstacle map(s) 118 can include information about one or more static obstacles located within one or more geographic areas.

The one or more data stores 115 can include sensor data 119. In this context, "sensor data" means any information about the sensors that a vehicle is equipped with, including the capabilities and other information about such sensors. As will be explained below, the vehicle 100 can include the sensor system 120. The sensor data 119 can relate to one or more sensors of the sensor system 120. As an example, in one or more arrangements, the sensor data 119 can include information on one or more LIDAR sensors 124 of the sensor system 120. As discussed above, in some embodiments, vehicle 100 can receive sensor data from other connected vehicles, from devices associated with other road users (ORUs), or both.

As noted above, the vehicle 100 can include the sensor system 120. The sensor system 120 can include one or more sensors. "Sensor" means any device, component and/or system that can detect, and/or sense something. The one or more sensors can be configured to detect, and/or sense in real-time. As used herein, the term "real-time" means a level of processing responsiveness that a user or system senses as sufficiently immediate for a particular process or determination to be made, or that enables the processor to keep up with some external process.

In arrangements in which the sensor system 120 includes a plurality of sensors, the sensors can function independently from each other. Alternatively, two or more of the sensors can work in combination with each other. In such a case, the two or more sensors can form a sensor network. The sensor system 120 and/or the one or more sensors can be operatively connected to the one or more processors 110, the data store(s) 115, and/or another element of the vehicle 100 (including any of the elements shown in FIG. 1).

The sensor system 120 can include any suitable type of sensor. Various examples of different types of sensors will be described herein. However, it will be understood that the implementations are not limited to the particular sensors described. The sensor system 120 can include one or more vehicle sensors 121. The vehicle sensors 121 can detect, determine, and/or sense information about the vehicle 100 itself, including the operational status of various vehicle components and systems.

In one or more arrangements, the vehicle sensors 121 can be configured to detect, and/or sense position and/or orientation changes of the vehicle 100, such as, for example, based on inertial acceleration. In one or more arrangements, the vehicle sensors 121 can include one or more accelerometers, one or more gyroscopes, an inertial measurement unit (IMU), a dead-reckoning system, a global navigation satellite system (GNSS), a navigation system 147, and/or other suitable sensors. The vehicle sensors 121 can be configured to detect, and/or sense one or more characteristics of the vehicle 100. In one or more arrangements, the vehicle sensors 121 can include a speedometer to determine a current speed of the vehicle 100.

Alternatively, or in addition, the sensor system 120 can include one or more environment sensors 122 configured to acquire, and/or sense driving environment data. "Driving environment data" includes any data or information about the external environment in which a vehicle is located or one or more portions thereof. For example, the one or more environment sensors 122 can be configured to detect, quantify, and/or sense obstacles in at least a portion of the external environment of the vehicle 100 and/or information/data about such obstacles. The one or more environment sensors 122 can be configured to detect, measure, quantify, and/or sense other things in at least a portion the external environment of the vehicle 100, such as, for example, nearby vehicles, lane markers, signs, traffic lights, traffic signs, lane lines, crosswalks, curbs proximate the vehicle 100, off-road objects, etc.

Various examples of sensors of the sensor system 120 will be described herein. The example sensors may be part of the one or more environment sensors 122 and/or the one or more vehicle sensors 121. Moreover, the sensor system 120 can include operator sensors that function to track or otherwise monitor aspects related to the driver/operator of the vehicle 100. However, it will be understood that the implementations are not limited to the particular sensors described. As an example, in one or more arrangements, the sensor system 120 can include one or more radar sensors 123, one or more LIDAR sensors 124, one or more sonar sensors 125, and/or one or more cameras 126.

The vehicle 100 can further include a communication system 130. The communication system 130 can include one or more components configured to facilitate communication between the vehicle 100 and one or more communication sources. Communication sources, as used herein, refers to people or devices with which the vehicle 100 can communicate with, such as external networks, computing devices, operator or occupants of the vehicle 100, or others. As part of the communication system 130, the vehicle 100 can include an input system 131. An "input system" includes any device, component, system, element or arrangement or groups thereof that enable information/data to be entered into a machine. In one or more examples, the input system 131 can receive an input from a vehicle occupant (e.g., a driver or a passenger). The vehicle 100 can include an output system 132. An "output system" includes any device, component, or arrangement or groups thereof that enable information/data to be presented to the one or more communication sources (e.g., a person, a vehicle passenger, etc.). The communication system 130 can further include specific elements which are part of or can interact with the input system 131 or the output system 132, such as one or more display device(s) 133, and one or more audio device(s) 134 (e.g., speakers and microphones).

The vehicle 100 can include one or more vehicle systems 140. Various examples of the one or more vehicle systems 140 are shown in FIG. 1. However, the vehicle 100 can include more, fewer, or different vehicle systems. It should be appreciated that although particular vehicle systems are separately defined, each or any of the systems or portions thereof may be otherwise combined or segregated via hardware and/or software within the vehicle 100. The vehicle 100 can include a propulsion system 141, a braking system 142, a steering system 143, throttle system 144, a transmission system 145, a signaling system 146, and/or a navigation system 147. Each of these systems can include one or more devices, components, and/or combinations thereof, now known or later developed.

The one or more processors 110 can be operatively connected to communicate with the various vehicle systems 140 and/or individual components thereof. For example, returning to FIG. 1, the one or more processors 110 can be in communication to send and/or receive information from the various vehicle systems 140 to control the movement, speed, maneuvering, heading, direction, etc. of the vehicle 100. The one or more processors 110 may control some or all of these vehicle systems 140.

The vehicle 100 can include one or more modules, at least some of which are described herein. The modules can be implemented as computer-readable program code that, when executed by a processor 110, implement one or more of the various processes described herein. The processor 110 can be a device, such as a CPU, which is capable of receiving and executing one or more threads of instructions for the purpose of performing a task. One or more of the modules can be a component of the one or more processors 110, or one or more of the modules can be executed on and/or distributed among other processing systems to which the one or more processors 110 is operatively connected. The modules can include instructions (e.g., program logic) executable by one or more processors 110. Alternatively, or in addition, one or more data store 115 may contain such instructions.

In one or more arrangements, one or more of the modules described herein can include artificial or computational intelligence elements, e.g., neural network, fuzzy logic or other machine learning algorithms. Further, in one or more arrangements, one or more of the modules can be distributed among a plurality of the modules described herein. In one or more arrangements, two or more of the modules described herein can be combined into a single module.

Detailed implementations are disclosed herein. However, it is to be understood that the disclosed implementations are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations. Various implementations are shown in FIGS. 1-13, but the implementations are not limited to the illustrated structure or application.

The flowcharts and block diagrams in the figures illustrate the architecture, functionality, and operation of possible implementations of systems, methods, and computer program products according to various implementations. In this regard, each block in the flowcharts or block diagrams can represent a module, segment, or portion of code, which comprises one or more executable instructions for implementing the specified logical function(s). It should also be noted that, in some alternative implementations, the functions noted in the block can occur out of the order noted in the figures. For example, two blocks shown in succession can be executed substantially concurrently, or the blocks can sometimes be executed in the reverse order, depending upon the functionality involved.

The systems, components and/or methods described above can be realized in hardware or a combination of hardware and software and can be realized in a centralized fashion in one processing system or in a distributed fashion where different elements are spread across several interconnected processing systems. Any kind of processing system or other apparatus adapted for carrying out the methods described herein is suited. A typical combination of hardware and software can be a processing system with computer-usable program code that, when being loaded and executed, controls the processing system such that it carries out the methods described herein. The systems, components and/or methods also can be embedded in a computer-readable storage, such as a computer program product or other data programs storage device, readable by a machine, tangibly embodying a program of instructions executable by the machine to perform methods and methods described herein. These elements also can be embedded in an application product which comprises all the features enabling the implementation of the methods described herein and, which when loaded in a processing system, is able to carry out these methods.

Furthermore, arrangements described herein can take the form of a computer program product embodied in one or more computer-readable media having computer-readable program code embodied or embedded, such as stored thereon. Any combination of one or more computer-readable media can be utilized. The computer-readable medium can be a computer-readable signal medium or a computer-readable storage medium. The phrase "computer-readable storage medium" means a non-transitory storage medium. A computer-readable storage medium can be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk drive (HDD), a solid state drive (SSD), a RAM, a ROM, an EPROM or Flash memory, an optical fiber, a portable compact disc read-only memory (CD-ROM), a digital versatile disc (DVD), an optical storage device, a magnetic storage device, or any suitable combination of the foregoing. In the context of this document, a computer-readable storage medium can be any tangible medium that can contain, or store a program for use by, or in connection with, an instruction execution system, apparatus, or device.

Program code embodied on a computer-readable medium can be transmitted using any appropriate medium, including but not limited to wireless, wireline, optical fiber, cable, RF, etc., or any suitable combination of the foregoing. Computer program code for carrying out operations for aspects of the present arrangements can be written in any combination of one or more programming languages, including an object-oriented programming language such as Java™, Smalltalk, C++ or the like and conventional procedural programming languages, such as the "C" programming language or similar programming languages. The program code can execute entirely on the user's computer, partly on the user's computer, as a stand-alone software package, partly on the user's computer and partly on a remote computer, or entirely on the remote computer or server. In the latter scenario, the remote computer can be connected to the user's computer through any type of network, including a LAN or a WAN, or the connection can be made to an external computer (for example, through the Internet using an Internet Service Provider).

In the description above, certain specific details are outlined in order to provide a thorough understanding of various implementations. However, one skilled in the art will understand that the invention may be practiced without these details. In other instances, well-known structures have not been shown or described in detail to avoid unnecessarily obscuring descriptions of the implementations. Unless the context requires otherwise, throughout the specification and claims which follow, the word "comprise" and variations thereof, such as, "comprises" and "comprising" are to be construed in an open, inclusive sense, that is, as "including, but not limited to." Further, headings provided herein are for convenience only and do not interpret the scope or meaning of the claimed invention.

Reference throughout this specification to "one or more implementations" or "an implementation" means that a particular feature, structure or characteristic described in connection with the implementation is included in at least one or more implementations. Thus, the appearances of the phrases "in one or more implementations" or "in an implementation" in various places throughout this specification are not necessarily all referring to the same implementation. Furthermore, the particular features, structures, or characteristics may be combined in any suitable manner in one or more implementations. Also, as used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings (such as "Background" and "Summary") and sub-headings used herein are intended only for general organization of topics within the present disclosure and are not intended to limit the disclosure of the technology or any aspect thereof. The recitation of multiple implementations having stated features is not intended to exclude other implementations having additional features, or other implementations incorporating different combinations of the stated features. As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that an implementation can or may comprise certain elements or features does not exclude other implementations of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one aspect, or various aspects means that a particular feature, structure, or characteristic described in connection with an implementation or particular system is included in at least one or more implementations or aspect. The appearances of the phrase "in one aspect" (or variations thereof) are not necessarily referring to the same aspect or implementation. It should also be understood that the various method steps discussed herein do not have to be carried out in the same order as depicted, and not each method step is required in each aspect or implementation.

Generally, "module," as used herein, includes routines, programs, objects, components, data structures, and so on that perform particular tasks or implement particular data types. In further aspects, a memory generally stores the noted modules. The memory associated with a module may be a buffer or cache embedded within a processor, a RAM, a ROM, a flash memory, or another suitable electronic storage medium. In still further aspects, a module as envisioned by the present disclosure is implemented as an application-specific integrated circuit (ASIC), a hardware component of a system on a chip (SoC), as a programmable logic array (PLA), or as another suitable hardware component that is embedded with a defined configuration set (e.g., instructions) for performing the disclosed functions.

The terms "a" and "an," as used herein, are defined as one as or more than one. The term "plurality," as used herein, is defined as two or more than two. The term "another," as used herein, is defined as at least a second or more. The terms "including" and/or "having," as used herein, are defined as including (i.e., open language). The phrase "at least one of . . . and . . . " as used herein refers to and encompasses any and all possible combinations of one or more of the associated listed items. As an example, the phrase "at least one of A, B and C" includes A only, B only, C only, or any combination thereof (e.g., AB, AC, BC or ABC).

The preceding description of the implementations has been provided for purposes of illustration and description. It is not intended to be exhaustive or to limit the disclosure. Individual elements or features of a particular implementation are generally not limited to that particular implementation, but, where applicable, are interchangeable and can be used in a selected implementation, even if not specifically shown or described. The same may also be varied in many ways. Such variations should not be regarded as a departure from the disclosure, and all such modifications are intended to be included within the scope of the disclosure.

While the preceding is directed to implementations of the disclosed devices, systems, and methods, other and further implementations of the disclosed devices, systems, and methods can be devised without departing from the basic scope thereof. The scope thereof is determined by the claims that follow.

What is claimed is:

1. A system for improving the brightness of a transparent display, the system comprising:
   an array of Fresnel lenses disposed on an external surface of a vehicle to collect ambient light;
   an adjustable transmission and reflection filter that controls how much light is collected as internal light from headlights of the vehicle;
   optical color filters to produce filtered ambient light from the ambient light and filtered internal light from the internal light, the filtered ambient light and the filtered internal light including red, green, and blue color components;
   a processor;
   a light-emitting-diode (LED) light source that, under control of the processor, produces primary-source light by outputting, in a predetermined alternating manner, red, green, and blue light; and a memory storing machine-readable instructions that, when executed by the processor, cause the processor to control injection, into a transparent edge-lit liquid crystal waveguide display deployed in at least a portion of a window of the vehicle, the primary-source light, the filtered ambient light, and the filtered internal light, wherein the red, green, and blue color components of the filtered ambient light and the filtered internal light are time-synchronized with the red, green, and blue light, respectively, of the primary-source light and the filtered ambient light and the filtered internal light improve the brightness of the transparent edge-lit liquid crystal waveguide display.

2. The system of claim 1, wherein the ambient light is sunlight.

3. The system of claim 1, wherein the external surface of the vehicle includes one or more of a rooftop of the vehicle, at least one pillar of the vehicle, and an awning of the vehicle.

4. The system of claim 1, wherein the transparent edge-lit liquid crystal waveguide display is a dual-sided transparent display.

5. The system of claim 1, wherein the machine-readable instructions include further instructions that, when executed by the processor, cause the processor to detect automatically a direction from which sunlight is shining on the vehicle and adjust the array of Fresnel lenses to face toward the direction.

6. The system of claim 1, wherein the array of Fresnel lenses acts as the optical color filters for the ambient light by producing, through wavelength separation, the red, green, and blue color components of the filtered ambient light.

7. The system of claim 1, wherein the transparent edge-lit liquid crystal waveguide display is a touch screen system.

8. A non-transitory computer-readable medium for improving the brightness of a transparent display and storing instructions that, when executed by a processor, cause the processor to control injection, into a transparent edge-lit liquid crystal waveguide display deployed in at least a portion of a window of a vehicle, primary-source light, filtered ambient light, and filtered internal light, wherein:
the primary-source light is generated using a light-emitting-diode (LED) light source that outputs, in a predetermined alternating manner, red, green, and blue light;
ambient light is collected using an array of Fresnel lenses disposed on an external surface of the vehicle;
internal light is collected from headlights of the vehicle;
the ambient light and the internal light are filtered to produce the filtered ambient light and the filtered internal light, the filtered ambient light and the filtered internal light including red, green, and blue color components;
the red, green, and blue color components of the filtered ambient light and the filtered internal light are time-synchronized with the red, green, and blue light, respectively, of the primary-source light; and
the filtered ambient light and the filtered internal light improve the brightness of the transparent edge-lit liquid crystal waveguide display.

9. The non-transitory computer-readable medium of claim 8, wherein the ambient light is sunlight.

10. The non-transitory computer-readable medium of claim 8, wherein the external surface of the vehicle includes one or more of a rooftop of the vehicle, at least one pillar of the vehicle, and an awning of the vehicle.

11. The non-transitory computer-readable medium of claim 8, wherein the transparent edge-lit liquid crystal waveguide display is a dual-sided transparent display.

12. The non-transitory computer-readable medium of claim 8, wherein the instructions include further instructions that, when executed by the processor, cause the processor to detect automatically a direction from which sunlight is shining on the vehicle and adjust the array of Fresnel lenses to face toward the direction.

13. The non-transitory computer-readable medium of claim 8, wherein the transparent edge-lit liquid crystal waveguide display is a touch screen system.

14. A method, comprising:
collecting ambient light using an array of Fresnel lenses disposed on an external surface of a vehicle;
collecting internal light from headlights of the vehicle;
filtering the ambient light and the internal light to produce filtered ambient light and filtered internal light, the filtered ambient light and the filtered internal light including red, green, and blue color components;
generating primary-source light using a light-emitting-diode (LED) light source that outputs, in a predetermined alternating manner, red, green, and blue light; and
injecting, into a transparent edge-lit liquid crystal waveguide display deployed in at least a portion of a window of the vehicle, the primary-source light, the filtered ambient light, and the filtered internal light, wherein the red, green, and blue color components of the filtered ambient light and the filtered internal light are time-synchronized with the red, green, and blue light, respectively, of the primary-source light and the filtered ambient light and the filtered internal light improve the brightness of the transparent edge-lit liquid crystal waveguide display.

15. The method of claim 14, wherein the ambient light is sunlight.

16. The method of claim 14, wherein the external surface of the vehicle includes one or more of a rooftop of the vehicle, at least one pillar of the vehicle, and an awning of the vehicle.

17. The method of claim 14, wherein the transparent edge-lit liquid crystal waveguide display is a dual-sided transparent display.

18. The method of claim 14, further comprising automatically detecting a direction from which sunlight is shining on the vehicle and adjusting the array of Fresnel lenses to face toward the direction.

19. The method of claim 14, wherein the filtering the ambient light to produce the filtered ambient light includes using wavelength separation at the array of Fresnel lenses to produce the red, green, and blue color components of the filtered ambient light.

20. The method of claim 14, wherein the transparent edge-lit liquid crystal waveguide display is a touch screen system.

* * * * *